(12) United States Patent
Gebhart et al.

(10) Patent No.: US 8,329,006 B2
(45) Date of Patent: Dec. 11, 2012

(54) ELECTROPLATING CELL WITH HYDRODYNAMICS FACILITATING MORE UNIFORM DEPOSITION ACROSS A WORKPIECE DURING PLATING

(75) Inventors: Lawrence E. Gebhart, Clayton, OH (US); Jenny J. Sun, Tipp City, OH (US); Phillip O. Miller, Dayton, OH (US); E. Jennings Taylor, Troy, OH (US)

(73) Assignee: Faraday Technology, Inc., Clayton, OH (US)

( * ) Notice: Subject to any disclaimer, the term of this patent is extended or adjusted under 35 U.S.C. 154(b) by 25 days.

(21) Appl. No.: 12/431,030

(22) Filed: Apr. 28, 2009

(65) Prior Publication Data

US 2009/0205953 A1 Aug. 20, 2009

Related U.S. Application Data

(62) Division of application No. 10/804,841, filed on Mar. 19, 2004, now Pat. No. 7,553,401.

(51) Int. Cl.
*C25D 17/00* (2006.01)
*C25D 5/08* (2006.01)

(52) U.S. Cl. .............. 204/230.3; 204/237; 204/275.1; 204/DIG. 7; 205/97

(58) Field of Classification Search .......... 204/275.1, 204/230.3, 237, DIG. 7
See application file for complete search history.

(56) References Cited

U.S. PATENT DOCUMENTS

| | | | |
|---|---|---|---|
| 4,696,729 A * | 9/1987 | Santini ............... 204/224 R |
| 5,256,274 A * | 10/1993 | Poris ..................... 205/123 |
| 5,599,437 A | 2/1997 | Taylor et al. |
| 5,616,246 A | 4/1997 | Gagnon et al. |
| 5,776,327 A | 7/1998 | Botts et al. |
| 5,804,057 A | 9/1998 | Zhou et al. |
| 5,865,971 A | 2/1999 | Sunkara |
| 6,048,584 A | 4/2000 | Josefowicz |
| 6,080,504 A | 6/2000 | Taylor et al. |
| 6,113,769 A | 9/2000 | Uzoh et al. |
| 6,120,658 A * | 9/2000 | Dunn et al. .......... 204/279 |
| 6,179,983 B1 * | 1/2001 | Reid et al. ............ 205/96 |
| 6,203,684 B1 | 3/2001 | Taylor et al. |
| 6,210,555 B1 | 4/2001 | Taylor et al. |
| 6,221,235 B1 | 4/2001 | Gebhart |
| 6,303,014 B1 | 10/2001 | Taylor et al. |
| 6,309,528 B1 | 10/2001 | Taylor et al. |
| 6,319,384 B1 | 11/2001 | Taylor et al. |
| 6,402,931 B1 | 6/2002 | Zhou et al. |
| 6,524,461 B2 | 2/2003 | Taylor et al. |
| 6,551,485 B1 | 4/2003 | Taylor |
| 6,558,231 B1 | 5/2003 | Taylor |

(Continued)

OTHER PUBLICATIONS

F. A. Lowenheim, Electroplating, McGraw-Hill Book Co., New York, 1978, pp. 138-139.*

(Continued)

*Primary Examiner* — Patrick Ryan
*Assistant Examiner* — William Leader
(74) *Attorney, Agent, or Firm* — Thompson Hine L.L.P.

(57) ABSTRACT

An apparatus for establishing more uniform deposition across one or more faces of a workpiece in an electroplating process. The apparatus employs eductors in conjunction with a flow dampener member and other measures to provide a more uniform current distribution and a more uniform metal deposit distribution as reflected in a coefficient of variability that is lower than conventional processes.

27 Claims, 14 Drawing Sheets

U.S. PATENT DOCUMENTS

| | | |
|---|---|---|
| 6,610,189 B2 | 8/2003 | Wang et al. |
| 6,652,727 B2 | 11/2003 | Taylor et al. |
| 6,676,825 B1 | 1/2004 | Gebhart |
| 6,750,144 B2 | 6/2004 | Taylor |
| 6,818,115 B2 | 11/2004 | van Kempen et al. |
| 6,890,416 B1 | 5/2005 | Mayer et al. |
| 6,974,530 B2 | 12/2005 | Bonkass et al. |
| 7,223,690 B2 | 5/2007 | Kondo et al. |
| 2002/0033341 A1 | 3/2002 | Taylor et al. |
| 2002/0038764 A1 | 4/2002 | Taylor et al. |
| 2003/0075450 A1 | 4/2003 | Taylor et al. |
| 2004/0004006 A1 | 1/2004 | Taylor et al. |
| 2004/0011666 A1 | 1/2004 | Taylor et al. |
| 2004/0245112 A1 | 12/2004 | Sekimoto et al. |
| 2005/0178667 A1 | 8/2005 | Wilson et al. |
| 2006/0151328 A1 | 7/2006 | Reents et al. |

OTHER PUBLICATIONS

William Morris, editor, The American Heritage Dictionary of the English Language, new college edition, Houghton Mifflin Company, Boston, 1976, pp. 223.*

F. A. Lowenheim, Electroplating, McGraw-Hill Book Company, New York, 1978, pp. 152-155.*

Schlesinger, M. et al., *Modern Electroplating*, Fourth Edition, John Wiley & Sons, Inc. (2000).

Paunovic, M. et al., *Fundamentals of Electrochemical Deposition*, John Wiley & Sons, Inc. (1998).

Ward, M. et al., "The effects of pulsed current in conjunction with eductor agitation for acid copper electroplating: A study for improved quality in PCB manufacture," *European PCB Convention*, Munich, Germany (1999).

Weber, A., "The Importance of Plating Cell Design and Hydrodynamics for Repeatable Product Quality in Latest Generation Vertical Platers for the Galvanic Industry," *IPC Printed Circuits Expo*, Long Beach, California (2003).

Chin, D-T et al., "Mass Transfer to an Impinging Jet Electrode," *J. Electrochem. Soc.*, 125, 9, pp. 1461-1470 (Sep. 1978).

Hsueh, K-L. et al., "Mass Transfer to a Cylindrical Surace from an Unsubmerged Impinging Jet," *J. Electrochem. Soc.*, vol. 133, No. 1, pp. 75-81 (Jan. 1986).

Hsueh, K-L. et al., "Mass Transfer of a Submerged Jet Impinging on a Cylindrical Surface," *J. Electrochem. Soc.*, vol. 133, No. 9, pp. 1845-1850 (Sep. 1986).

Ward, M. et al., "Novel Agitation for PCB Production: Use of Eductor Technology," *Trans. IMF*, 76(4), pp. 121-126 (1998).

Ward, M. et al., "Exploitation of eductor agitation in copper electroplating," *Proc. SURFIN 1999*, Cincinnati, Ohio, (Jun. 1999).

Chin, D-T. et al., Mass Transfer from an Oblique Impinging Slot Jet, *J. Electrochem. Soc.*, vol. 138, No. 9, pp. 2643-2650 (Sep. 1991).

Carano, M., "Hole Preparation & Metallization of High Aspect Ratio, High Reliability Back Panels, Part 2," *Circuitree*, pp. 10-22 (Feb. 2003).

Lowenheim, F.A., Electroplating, McGraw-Hill Book Co., New York, pp. 152-153 (1978).

Dictionary.com definitions of "eductor" and "dampener".

PCT, International Search Report and Written Opinion, PCT/US2008/072287 (Jul. 16, 2009).

* cited by examiner

ELECTROPLATING CELL WITH HYDRODYNAMICS FACILITATING MORE UNIFORM DEPOSITION ACROSS A WORKPIECE DURING PLATING

CROSS REFERENCE TO RELATED APPLICATION

This application is a divisional application of U.S. application Ser. No. 10/804,841 filed Mar. 19, 2004 now U.S. Pat. No. 7,553,401, and claims benefit thereto.

STATEMENT REGARDING FEDERALLY SPONSORED RESEARCH OR DEVELOPMENT

The experimental work leading to this invention was funded in part by Department of Defense SBIR Contract No. DASG60-01-C-0056.

FIELD OF THE INVENTION

The present invention relates to a method and apparatus for controlling the hydrodynamics in a plating cell to facilitate more uniform deposition across a workpiece such as a printed circuit board.

BACKGROUND OF THE INVENTION

The continuing miniaturization of electronic devices is driving the design of interconnects in the direction of finer pitch surface tracks, smaller diameter through-holes and vias, and thicker workpieces to provide increased circuit densities (Paunovic, M. and M. Schlesinger, 2000)[1]. This trend has significant implications for the electronics industry which must ensure that the metal electrodeposition process meets the functionality and quality requirements of these advanced workpiece device designs. These workpieces include printed circuit boards, chip scale packages, wafer level packages, printed wiring boards, high density interconnect printed wiring boards, high density interconnect printed circuit boards and the like.

For economies of production, the range of approximate dimensions of workpieces is typically 6 inch by 6 inch, 10 inch by 18 inch, 18 inch by 24 inch, 2 meters by 2 meters, 5 meters by 5 meters, and 200 millimeters and 300 millimeters in diameter. However, these range of dimensions are not unique and are not limiting to the need for controlling the hydrodynamics in a plating cell to facilitate uniform deposition across a workpiece.

As the hole and via diameter decrease, the workpiece thickness increases, and the workpiece dimension increases, the most notable challenge for the quality of metal electrodeposits is the avoidance of non-uniform copper thickness distribution over board surfaces and within through-holes, i.e. the challenge of leveling or throwing power, which can adversely affect the performance of the finished printed wiring board interconnect (Paunovic, M. and M. Schlesinger, 1998)[2], (Ward, M., D. R. Gabe and J. N. Crosby, 1999a)[3].

A number of operating parameters and plating cell attributes influence the uniformity of copper deposition onto a workpiece. This invention concentrates on the influence of electrochemical cell configuration on the uniformity of copper deposition on the board surface, in particular, the influence of cell configuration on solution hydrodynamics, and the ability to generate uniform flow of electrolyte across the surface of the board during the plating operation. FIG. 1 shows a plating cell (100) which contains a workpiece (102). Although only one workpiece is shown in this and subsequent drawings, one skilled in the art understands that in actual practice a plurality of workpieces may be contained in the plating cell. For ease of description, the term workpiece is understood to encompass one or more workpieces. The workpiece (102) in prior art FIGS. 2-3, 5, and 7-9 is presented as a generally flat panel having at least one generally flat surface for electroplating. Arrows (104) indicate the desired uniform flow of electrolyte across the entire surface of the workpiece (102).

FIG. 2 shows a conventional workpiece (102—shown in a side-view relative to its appearance in FIG. 1) plating operation, in which flow of electrolyte is achieved by air sparging. Air bubbles (106) are created in the electrolyte by blowing air through pipes (108) which have holes in them. These pipes are positioned on the bottom of the plating cell (100) beneath the workpiece (102). The number of pipes (108) is not limited. The movement of air bubbles (106) from the bottom to the top of the plating cell (100) creates solution movement, as indicated by the arrows (104). However, air sparging can create problems in the plating operation:

- the oxygen can oxidize components of the electrolyte,
- the oxygen can oxidize features and circuit patterns on the workpiece,
- air bubbles (106) may become trapped in features in the workpiece (102), creating areas where copper cannot be deposited,
- this method can generate low solution movement rates, which can result in burning of the workpiece (102) at high current densities, and
- as the air bubbles progress towards the top of the cell they grow in size and can create a non-uniform solution environment from the bottom of the workpiece to the top.

To avoid the problems associated with air sparging, eductors are being tested for use in plating cells designed for workpieces. Eductors are nozzles which utilize venturi effects to provide up to five times the solution flow velocity output of the pump which feeds the eductors. Eductors may be obtained commercially from a number of sources; one such eductor is marketed under the name Serductor™ (Serductor™ is a trademark of Serfilco, Northbrook, Ill.)[4].

One configuration of a prior art plating cell is shown in FIG. 3. The plating cell (100) contains a workpiece (102) which hangs on a rack (110). Anodes (112) are positioned on either side of the workpiece (102) and hang from rails (114). The workpiece (102) serves as the cathode. Eductors (116) are positioned behind the anodes (112) horizontally opposite (perpendicular to) the surface of the workpiece (102) (Weber, A., 2003)[5]. Fluid flow is directed (shown by the arrows (104)) from the eductors (116) between the anodes (112) to the surface of the workpiece (102). This type of eductor arrangement leads to impinging fluid flow whereby the solution flow velocity is directed toward the workpiece. Solution flow velocity is accomplished through the anodes by openings or spaces in the anodes.

However, as shown in FIG. 4, the use of eductors (116) can lead to a variation in solution flow velocity across the workpiece (102) (Chin, D-T. and C-H. Tsang, 1978)[6], (Hsueh, K-L. and D-T. Chin, 1986a)[7], (Hsueh, K-L. and D-T. Chin, 1986b)[8]. Fluid flows from the eductor (116) to the impingement point (118) on the surface of the workpiece (102). The fluid flow profile (120) and jet centerline (122) are shown. The flow from the eductor (116) is directly perpendicular to the surface of the workpiece (102). In region I, referred to as the potential core region, the flow from the eductor (116) mixes with the surrounding electrolyte. In region II, referred to as the established flow region, the velocity profile (124) is well established, and the solution flow velocity decreases as a function of distance from the eductor (116). In region III, referred to as the stagnation region, the velocity decreases to almost zero, and the boundary layer thickness is relatively independent of the radial position near the impingement point (118) and centerline (122). In region IV, referred to as the wall jet region, the radial velocity decreases and the boundary layer thickness increases, as a function of distance radially outward from the impingement point (118). These variations in solution flow velocity, termed the glancing effect, within regions III and IV contribute to variations in the thickness of copper deposited on the surface of the workpiece (102).

Efforts to improve the uniformity of flow under the impinging eductor flow configuration have included movement of the workpiece (102) while maintaining the same distance between the workpiece and the eductor (116). While the workpiece movement has generally been reported as left and right, the workpiece movement could conceivably be up and down or even at an angle while maintaining the same distance relative to the eductor. The goal of such movement is to produce a time-averaged uniform boundary layer across the workpiece (102). Such movement, particularly left and right movement is termed knife edge agitation by those skilled in the art. However, knife edge agitation still can result in non-uniformity of the deposited copper and adds complexity to plating cell design. Furthermore, incorporation of knife edge movement in existing workpiece plating lines is difficult and costly.

An alternative prior art configuration shown in FIG. 5 positions the eductors (116) below and off to either side of the workpiece, pointing obliquely at the workpiece surface (102) (Ward, M., D. R. Gabe, and J. N. Crosby, 1998)[9], (Ward, M., D. R. Gabe, and J. N. Crosby, 1999b)[10].

However, as shown in FIG. 6, the use of angled eductors (116) can lead to a variation in solution flow velocity across the workpiece (102) (Chin, D-T., and M. Agarwal, 1991)[11]. Fluid flows from the eductor (116) to the impingement point (118) on the surface of the workpiece (102). The fluid flow profile (120) and jet centerline (122) are shown. The flow from the eductor (116) is at an oblique angle to the surface of the workpiece (102). In region I, the potential core region, the flow from the eductor (116) mixes with the surrounding electrolyte. In region II, the established flow region, the velocity profile (124) is well established, and the solution flow velocity decreases as a function of distance from the eductor (116). In region III, the stagnation region, the velocity decreases to almost zero, and the boundary layer thickness is relatively independent of the radial position near the impingement point (118) and centerline (122). In this case, the stagnation point is shifted from the jet centerline. In regions IV and V, the wall jet regions, the velocity decreases and the boundary layer thickness increases, as a function of distance radially outward from the impingement point (118). Furthermore, the solution velocity and boundary layer thickness in region IV is different from that in region V. The glancing effect produces variations in solution flow velocity within regions III, IV, and V, and contributes to variations in the thickness of copper deposited on the surface of the workpiece (102).

An alternative configuration shown in FIG. 7 positions the eductors (116) below and off to either side of the workpiece, pointing obliquely across the workpiece (102) (Weber, A., 2003)[5]. The eductors (116) on one side of the workpiece (102) are pointed in one direction, and in the opposite direction on the other side (not shown in FIG. 7) of the workpiece (102). This is intended to create a swirling solution movement around the workpiece (102). However, the glancing effect described above applies in this case, leading to non-uniform flow of solution across the workpiece (102).

An alternative configuration shown in FIG. 8 positions the eductors (116) directly below the workpiece (102), pointing directly up so that solution moves past the surface of the workpiece (102) (Weber, A., 2003)[5] (Carano, M., 2003)[12]. Again, the glancing effect described above applies in this case, due to mixing of the flow profiles from the multiple eductors (116) positioned below the workpiece (102). This contributes to non-uniform flow of solution across the workpiece (102).

An alternative configuration shown in FIG. 9 positions the eductors (116) directly below and off to either side of the workpiece (102), pointing directly up so that solution moves past the surface of the workpiece (102) (Carano, M., 2003)[12]. The glancing effect described above applies in this case, contributing to non-uniform flow of solution across the workpiece (102).

Accordingly, a need exists for a method and apparatus which controls the hydrodynamics within a plating cell (100), to facilitate uniform distribution of metal onto a workpiece (102). This invention concentrates on the influence of cell configuration on the uniformity of deposition across the surface of the workpiece (102) as reflected in a low coefficient of variability.

SUMMARY OF THE INVENTION

The present invention relates to a method and apparatus for controlling the hydrodynamics in an electroplating cell (hereinafter called a plating cell), to facilitate a more uniform metal deposit distribution across the workpiece using an electrochemical plating process, wherein the metal deposit may be any metal of interest including but not limited to copper, gold, nickel, tin, lead-tin solder. More uniform deposition is a product of more uniform current distribution which is achieved at least in part from more uniform solution flow velocity across the workpiece. Uniform deposition is observed in a coefficient of variability (CoV) that is low by industry standards. In accordance with certain embodiments of the invention CoV less than about 10% and in many cases less than about 7% and in many cases on the order of about 5% or less is achieved.

One embodiment of the present invention more particularly relates to controlling the hydrodynamics in a plating cell, to facilitate uniform metal deposit distribution across a chip scale package using an electrochemical plating process.

Another embodiment of the present invention relates to controlling the hydrodynamics in a plating cell, to facilitate uniform metal deposit distribution across a wafer level package using an electrochemical plating process.

Still another embodiment of the present invention relates to controlling the hydrodynamics in a plating cell, to facilitate uniform metal deposit distribution across a printed wiring board using an electrochemical plating process.

Another embodiment of the present invention particularly relates to controlling the hydrodynamics in a plating cell, to facilitate uniform metal deposit distribution across a high density interconnect printed wiring board using an electrochemical plating process.

Still another embodiment of the present invention particularly relates to controlling the hydrodynamics in a plating cell, to facilitate uniform metal deposit distribution across a high density interconnect printed circuit board using an electrochemical plating process.

DETAILED DESCRIPTION OF PREFERRED EMBODIMENTS

Figure 1:
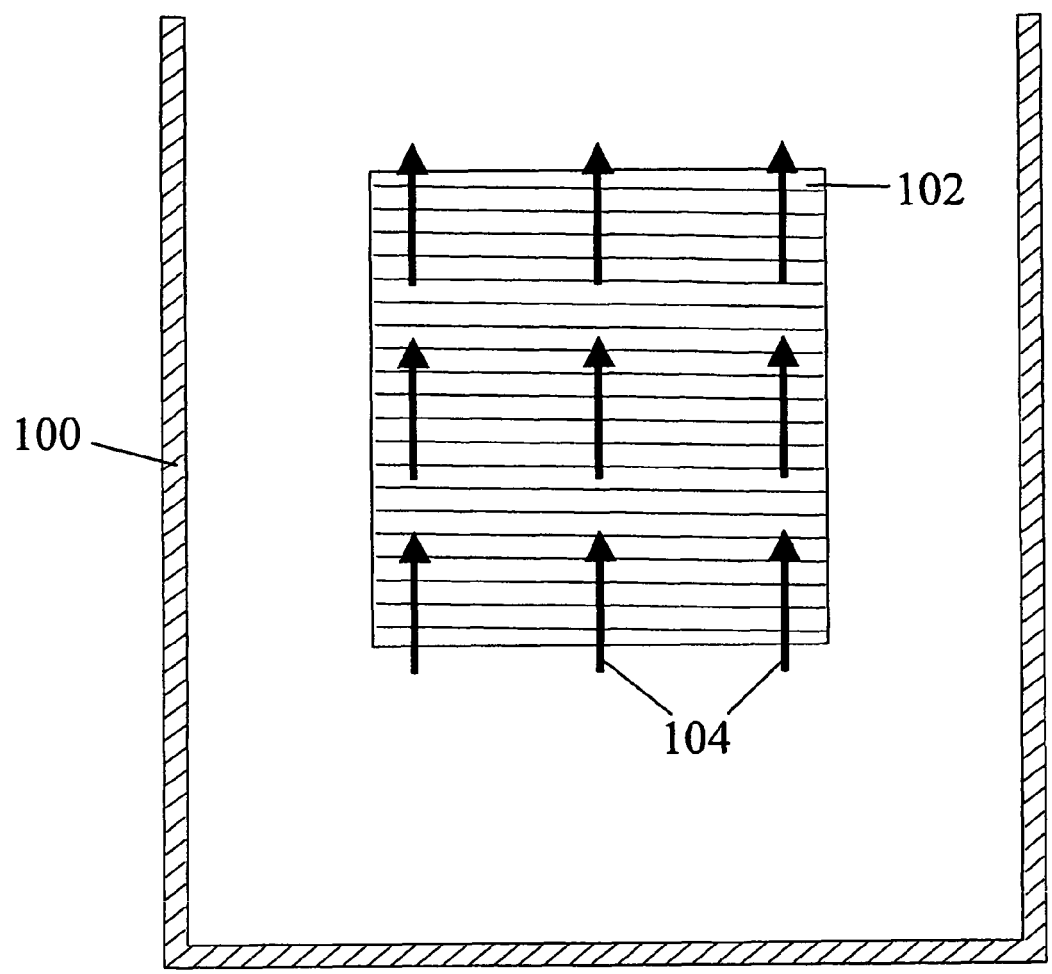
FIG. 1 is a schematic illustration of the cross-section of a plating cell containing a workpiece, with arrows showing the desired uniform solution flow velocity across the surface of the workpiece.

In the following detailed description, reference is made to the accompanying drawings which form a part hereof, and in which are illustrated specific embodiments in which the invention may be practiced.

Those skilled in the art will recognize that the invention is not limited to the specific embodiments illustrated in these drawings. In the drawings, the following parts have been identified by the following numbers.

Figure 10:
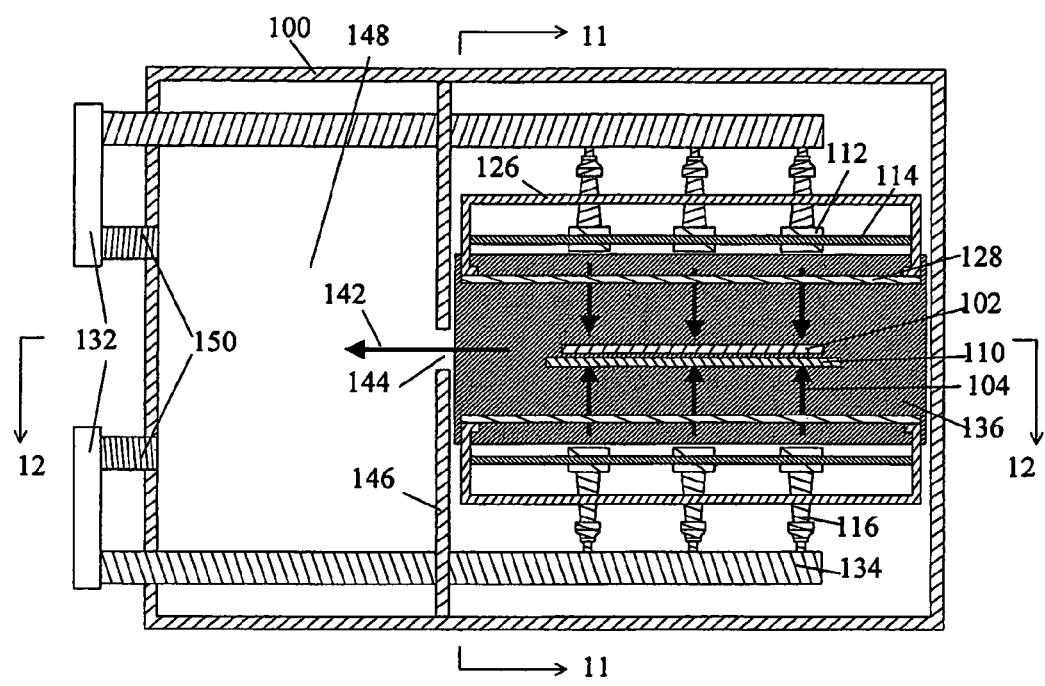
FIG. 10 is a schematic illustration of the cross-section of a plating cell in accordance with one embodiment of the present invention, viewed from the top, for controlling hydrodynamic flow within the plating cell, to enhance uniformity of electrochemical deposition of copper onto a workpiece. This figure shows the flow of electrolyte from the eductors to the workpiece, and out through a hole in a baffle in the plating cell, to a side chamber, the anodes and anode chambers, the porous fiber cloth on the anode chambers, and the workpiece. The non-conducting shielding on the anode chamber is not shown in FIG. 2 so that the porous fiber cloth can be seen in the figure.
Figure 11:
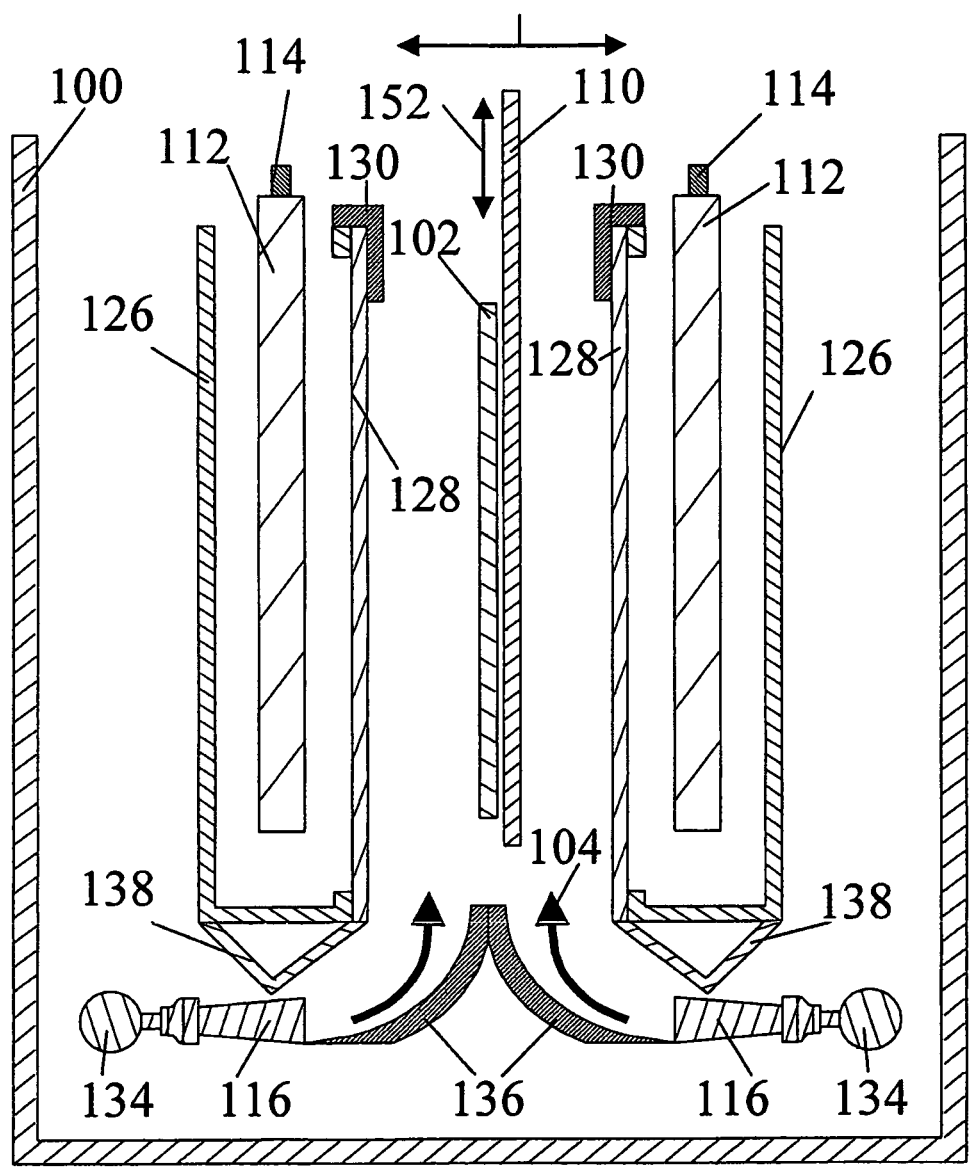
FIG. 11 provides another schematic illustration of the plating cell shown in FIG. 10, viewed from a side along the direction 11-11 of FIG. 10. Attributes of the plating cell shown in this figure include eductors, vertical vibration, oscillation perpendicular to the face of the panel workpiece, anode to workpiece distance, use of an anode chamber, use of a porous fiber cloth across the front of the anode chamber, anode non-conducting shielding and use of a baffle.
Figure 12:
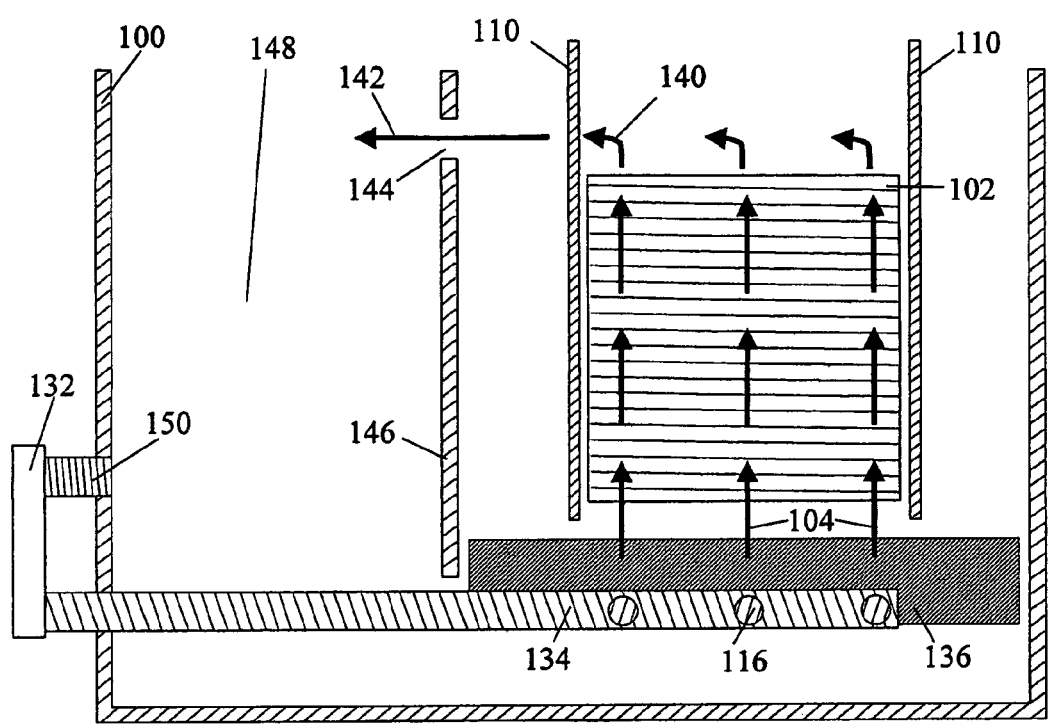
FIG. 12 provides another schematic illustration of the plating cell shown in FIGS. 10 and 11 viewed from a side along the direction 12-12 of FIG. 10. This figure shows the flow of electrolyte through the eductors, vertically up past the workpiece, and into a side chamber, from where it is pumped back to the eductors. The anodes and anode chambers are not shown in this view.

100. Plating cell
102. Workpiece
104. Arrow indicating electrolyte flow
106. Air bubbles
108. Pipe
110. Rack
112. Anode
114. Rail
116. Eductor
118. Impingement point
120. Fluid flow profile
122. Jet centerline
124. Velocity profile
126. Anode chamber
128. Porous fiber cloth
130. Non-conducting shielding
132. Pump
134. Manifold
136. Guide
138. Baffle
140. Arrow indicating electrolyte flow
142. Arrow indicating electrolyte flow
144. Hole
146. Baffle
148. Side chamber
150. Outlet hole
152. Arrow indicating vertical vibration
154. Arrow indicating oscillation
156. Copper foil
158. Measuring point FIGS. 10 to 12 show one embodiment of the present invention in a series of cross-sectional views. The following detailed description of the preferred embodiments refers to these figures. The plating cell (100) was designed with a range of attributes for enhancing the uniformity of deposition over the workpiece (102). The attributes are variable high velocity eductor-induced agitation, lateral oscillation of the workpiece perpendicular its face, use of an anode chamber, variable anode to workpiece distance, variable frequency vertical vibration of the workpiece, and non-conducting shielding of the anodes within the anode chamber. In the plating cell (100), the workpiece (102) serves as the cathode for metal deposition.

The plating cell (100), which, in one embodiment, holds 1700 liters of bath electrolyte is capable of accommodating one rack or workpiece holder (110) which holds one workpiece (102). In this embodiment, the workpiece is 18 inches by 24 inches high. The size of the plating cell (100), the number of workpieces (102), dimensions of the workpiece (102) and other specific details given here relate to a particular embodiment that was evaluated experimentally and are not limiting.

Sets of anodes (112) are hung on rails (114, FIGS. 10 and 11) on each side of the rack (110) and facing the workpiece (102), and may be encased in an anode chamber 126 (FIGS. 10 and 11). These anodes may be plates or, more typically, they are a panel of metallic balls. The anode chamber (126) may have a porous fiber cloth (128) between the anodes (112) and workpiece (102). The cloth may be formed from a polymeric material. This cloth (128) spreads the current distribution between the anodes (112) and the workpiece (102) such that the anode chamber (126) acts as a virtual anode. One cloth was obtained from CROSIBLE FILTRATION, located in Moravia, N.Y. 13118. It was specifically a 100% polypropylene filter material. The reported porosity was 2-4 cubic feet per minute. Other filter cloth available has a porosity of 20-30 cubic feet per minute. A wide variety of filter cloths would be acceptable provided they have pores small enough that for the given distance between the cloth and the workpiece the cloth serves as a virtual anode.

Non-conducting shielding (130) at the top of the anode chamber (126) prevents edge effects from affecting the uniformity of copper deposition on the workpiece (102). The distance from the anode chamber (126) to the workpiece (102) is adjustable, with a range varying from about 165 to 300 mm, and preferably from about 210 mm to 250 mm, and more preferably from about 210 to 220 mm.

In one embodiment two 300 L/min pumps (132) are used to circulate electrolyte through manifolds (134) on either side of the plating cell (100) and through eductors such as ½ in eductors (116) located horizontally under the anode chambers (126). In FIGS. 10-12, three eductors (116) are shown on each side of the plating cell (100). In one embodiment, the eductors are spaced on 6 inch centers, but the number of eductors (116) and the spacing may change from those cited and is not limiting. The number and placement of eductors (116) should be chosen so as to facilitate uniform flow of electrolyte across the entire surface of the workpiece (102) as described herein.

Electrolyte flowing out of the eductors (116) is directed vertically past the workpiece (102) by a solution flow velocity dampening member (136), whereby the variations in electrolyte solution are suppressed. In one embodiment of the invention, the solution flow velocity dampener is a series of shaped guides (136) located below the workpiece (102). The use of the shaped guides (136) directs the solution flow parallel the surface of the workpiece thereby dampening the variations in solution flow velocity described above in the prior art, reducing the glancing effect, and resulting in more uniform flow across the surface of the workpiece (102). The solution flow velocity dampening members that are useful herein may have a variety of shapes. For example, curved panel sections with various radii of curvature relative to the surface of the workpiece and flat ramps with various incline angles relative to the surface of the workpiece. As taught herein, the optimum configuration for the shaped dampening member is easily determined without undue experimentation by those of ordinary skill in the art. The radius of curvature utilized for one embodiment was 8.25 inches. A useful range may be about 6 to 12 inches for a plating cell in which the distance between the bottom of the shaped guide and the workpiece is approximately 10.5 inches.

Baffles (138, FIG. 11) below each anode chamber (126) prevent solution from flowing back to the other side of the anode chamber (126). The velocity of the electrolyte flowing past the workpiece (102) can be changed by 1) changing the pump (132) settings and 2) moving the anode chambers (126) closer to the workpiece (102). The electrolyte flows vertically up (indicated by arrows 104) past the workpiece (102) and then across (indicated by arrows 140) the top of the plating cell (100) and out (indicated by arrow 142) through a hole (144) in a baffle (146) in the plating cell (100) to a side chamber (148). Solution is suctioned through outlet holes (150) from the side chamber (148) through the pump(s) (132) and back through the manifolds (134) and out through the eductors (116). The side chamber (148) with its enclosed electrolyte and in conjunction with pump(s) (132) and manifold (134) serves as an electrolyte supply system. In one embodiment, as electrolyte is pumped through the eductors (116), electrolyte in the plating cell (100) is pulled into the eductors (116) in about a 4:1 ratio (4 parts electrolyte pulled into the eductors (116) from the plating cell (100) to 1 part electrolyte pumped through the eductors (116)) to increase the flow of electrolyte past the workpiece (102). A filter (not shown) in the side chamber (148) can be used to maintain cleanliness of the electrolyte.

In some cases, uniformity of metal distribution over the workpiece (102) can be improved by vibration of the workpiece (102). Vibration is in the vertical direction as shown by the double-ended arrow (152) adjacent to the rack (110) in FIG. 11. Vibration may be particularly important for workpieces with interconnect features such as fine pitch surface tracks, through-holes, vias and the like. Vibration of the workpiece (102) is accomplished by two horizontally mounted rotary eccentrically weighted devices powered by variable speed motors (not shown) and mounted to each end of the load bar (not shown) to which the rack (110) is attached. Those skilled in the art understand that other means for accomplishing vibration include, but are not limited to; pneumatic rotary ball device, pneumatic rotary turbine device, electromagnetic linear motion device, pneumatic sliding piston device, and ultrasonic electromagnetic device. The frequency of vibration available using this configuration typically ranges from about 0 to 3570 cycles per minute.

Oscillation of the workpiece (102) perpendicular to the anodes (112), as shown by the double-ended arrow (154) above the rack (110) in FIG. 11, or oscillation of the anodes (112) perpendicular to the workpiece (102) or oscillation of both anodes (112) and workpiece (102) with respect to each other results in the flow of electrolyte through the holes in the workpiece (102), improving the current distribution and therefore plated metal distribution on the workpiece (102). Oscillation may be particularly important for workpieces with interconnect features such as fine pitch surface tracks, through-holes, vias and the like. In one embodiment, oscillation of the workpiece (102) is produced by a positive drive from a variable speed motor-reducer with crank arm and linkage (not shown). Those skilled in the art understand that other means for accomplishing oscillation include, but are not limited to reversing rack and pinion device, off axis side crank device, grooved cam traverse mechanism device, yoke strap eccentric circular cam mechanism device, reversible worm screw jack device, electromechanical linear drive device, and reversible pneumatic or hydraulic cylinder device. The frequency of oscillation can shift from about 6 to 63 cycles per minute with a stroke of about 25 mm, although this range is not limited. This is the method of oscillation employed in this plating cell (100), although the invention is not limited to this method. Thus in one embodiment, the workpiece (102) is moved parallel to and/or perpendicular to the anodes (112).

In accordance with certain embodiments of the invention, uniformity of metal distribution over the workpiece (102) can be improved by changing the distance between the anodes (112) and the workpiece (102). The distance from the anode chamber (126) to the workpiece 102 may vary from about 165 to 300 mm, preferably from about 210 mm to 250 mm, and more preferably from about 210 to 220 mm.

Uniformity of metal distribution over the workpiece (102) can also be improved by placing non-conducting shielding (130) at the top of the anode chamber (126) to reduce edge effects.

Uniformity of metal distribution over the workpiece (102) can be further improved by placing a baffle (138) at the bottom of the anode chamber (126).

The invention is particularly useful in plating circuit boards having features such as through holes and vias. Because more uniform deposition is available in accordance with the invention, good plating of the features can be achieved independently of the location of the feature on the workpiece. Thus workpiece having more demanding features to plate can be successfully processed substantially independently of the location of the feature on the workpiece. Problems associated with uneven deposition due to uneven boundary layer due to uneven plating solution flow are minimized and a robust plating technique is provided.

The invention will be illustrated by the following examples, which are intended to be illustrative and not limiting.

EXAMPLE 1

Comparison

This example illustrates the use of the plating cell (100) with air sparging to deposit copper onto a workpiece (102), to demonstrate the prior art.

Figure 2:
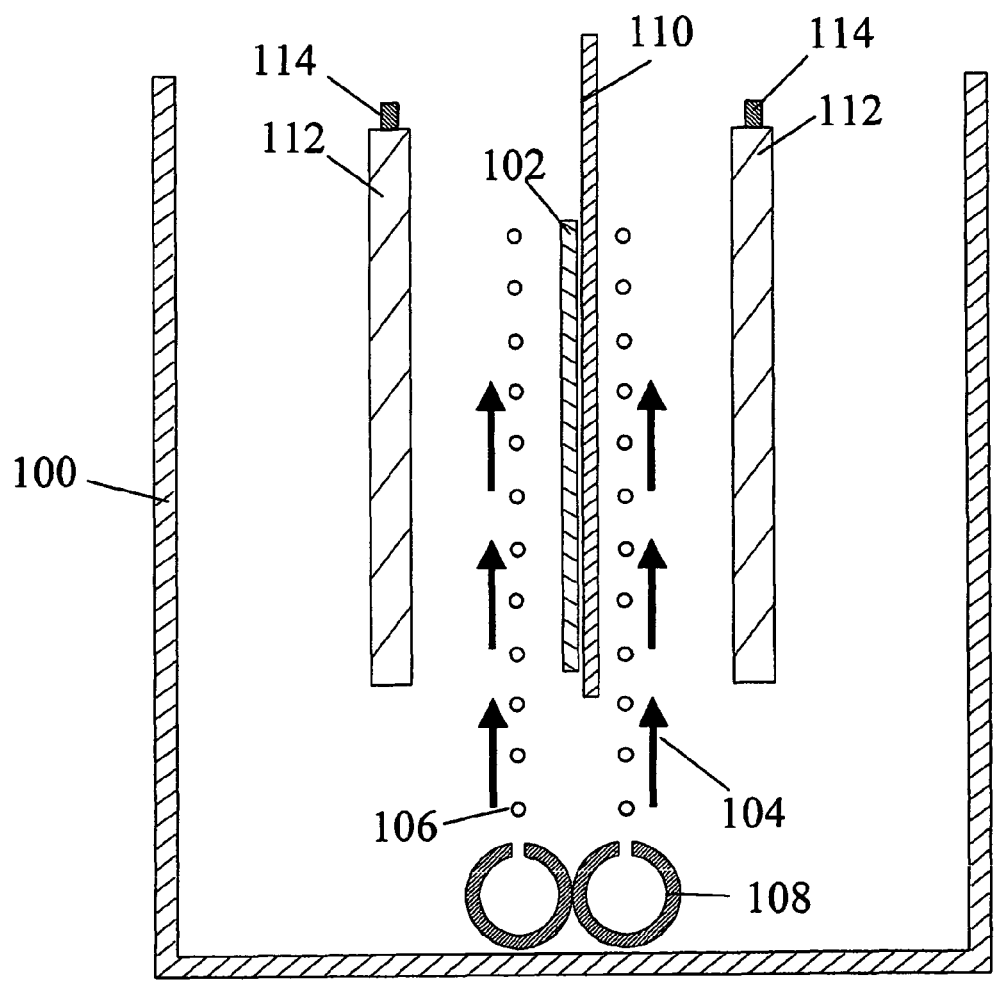
FIG. 2 is a schematic illustration of a prior art cell depicting the cross-section of a plating cell containing a workpiece and two anodes, with air sparging.
Figure 3:
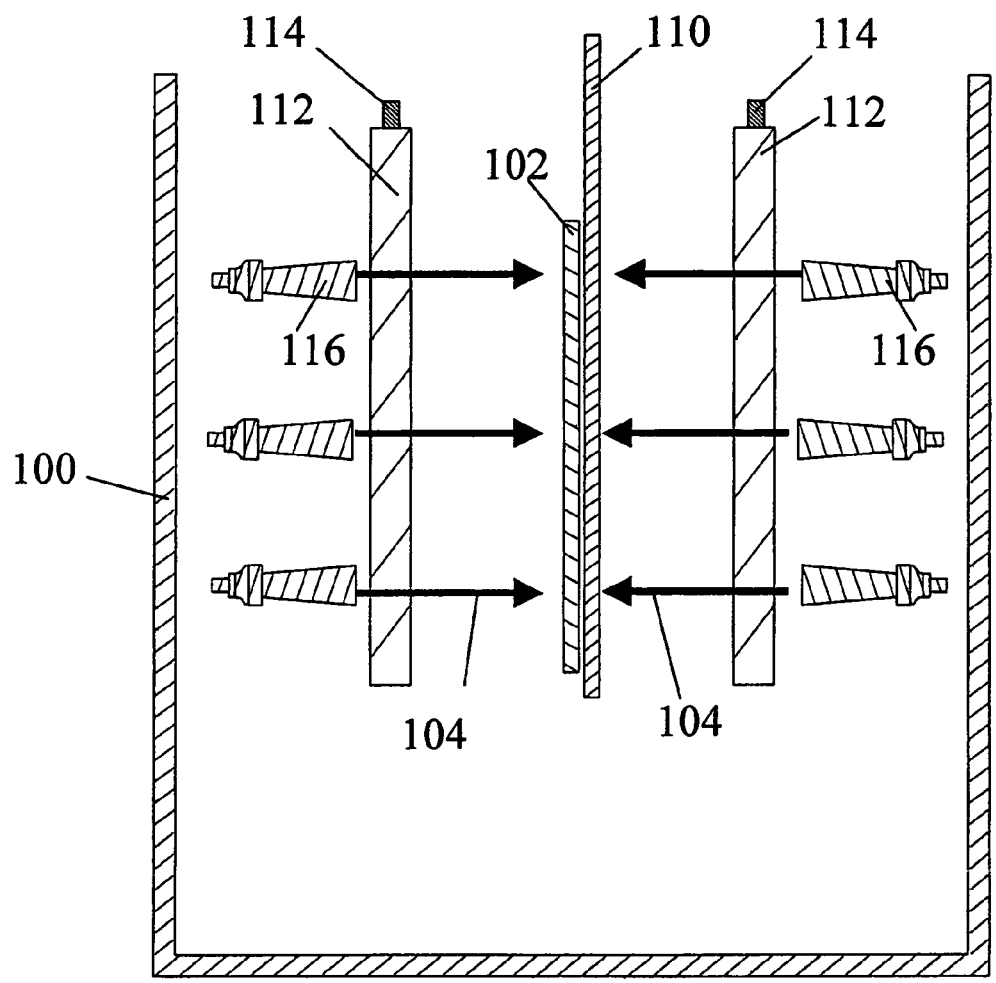
FIG. 3 is a schematic illustration of prior art depicting the cross-section of a plating cell containing a workpiece and two anodes, with horizontal eductors.
Figure 4:
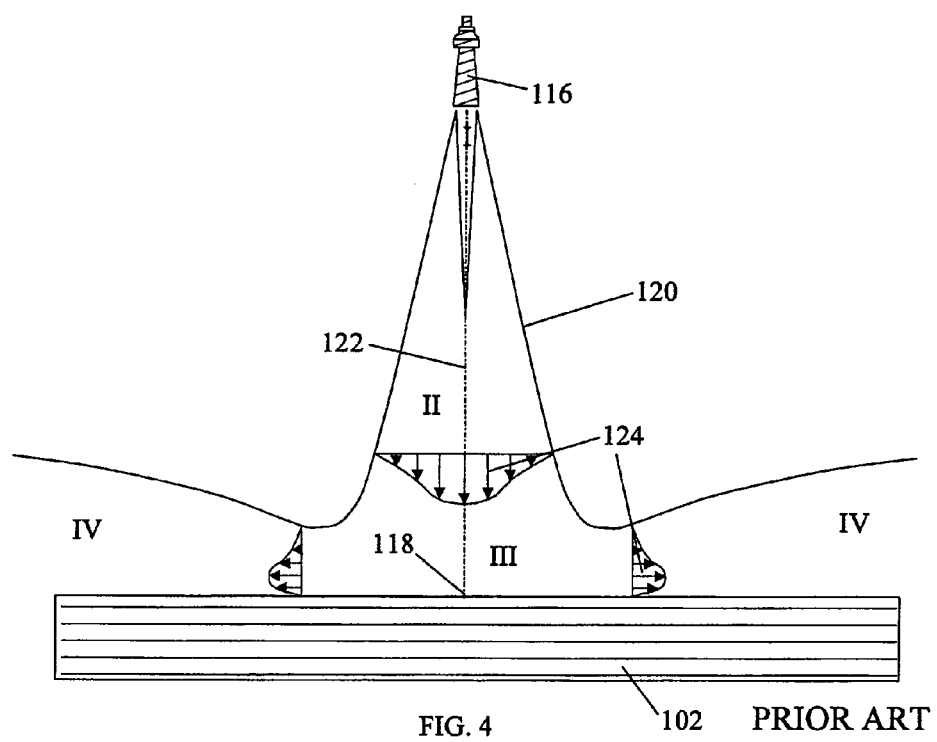
FIG. 4 is a schematic illustration of the velocity profile of the flow from an eductor directed onto the surface of a workpiece when the eductor is perpendicular to the workpiece in a prior art cell.
Figure 5:
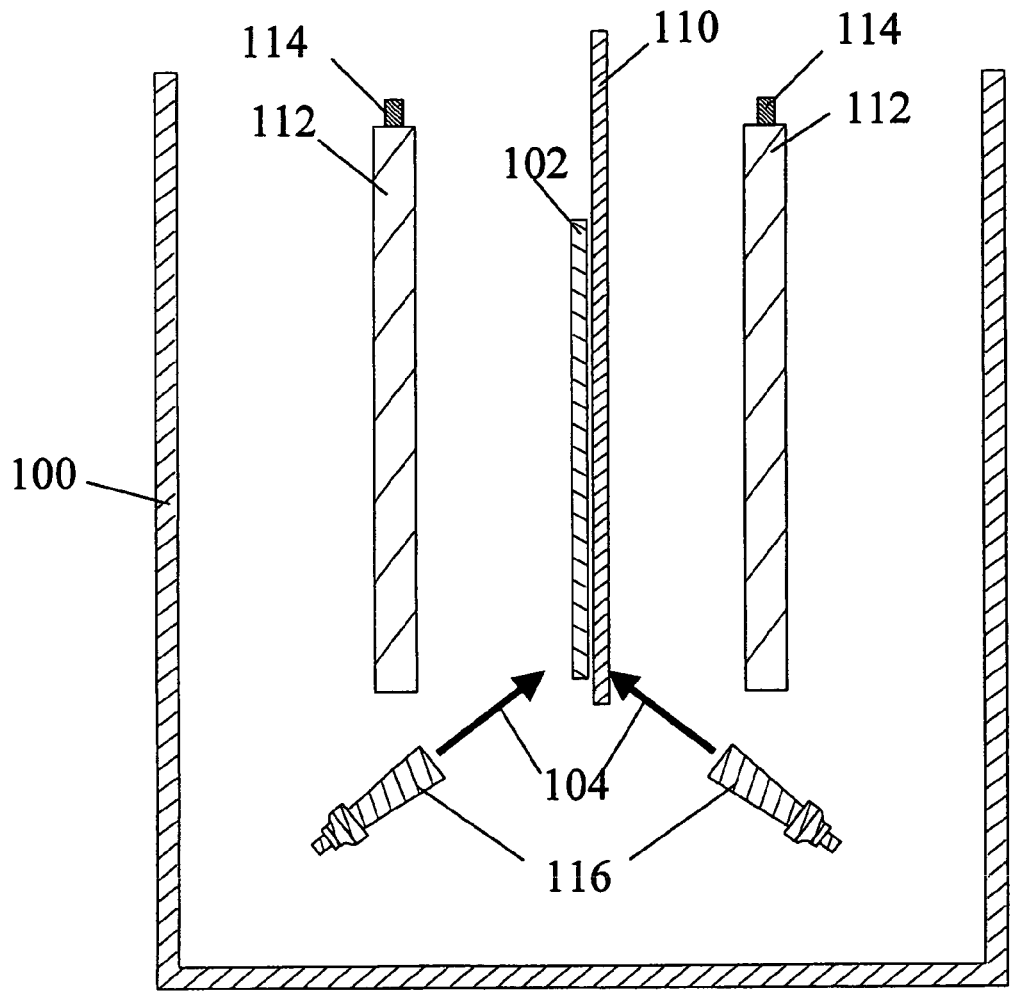
FIG. 5 is a schematic illustration of prior art depicting the cross-section of a plating cell containing a workpiece and two anodes with angled eductors.
Figure 6:
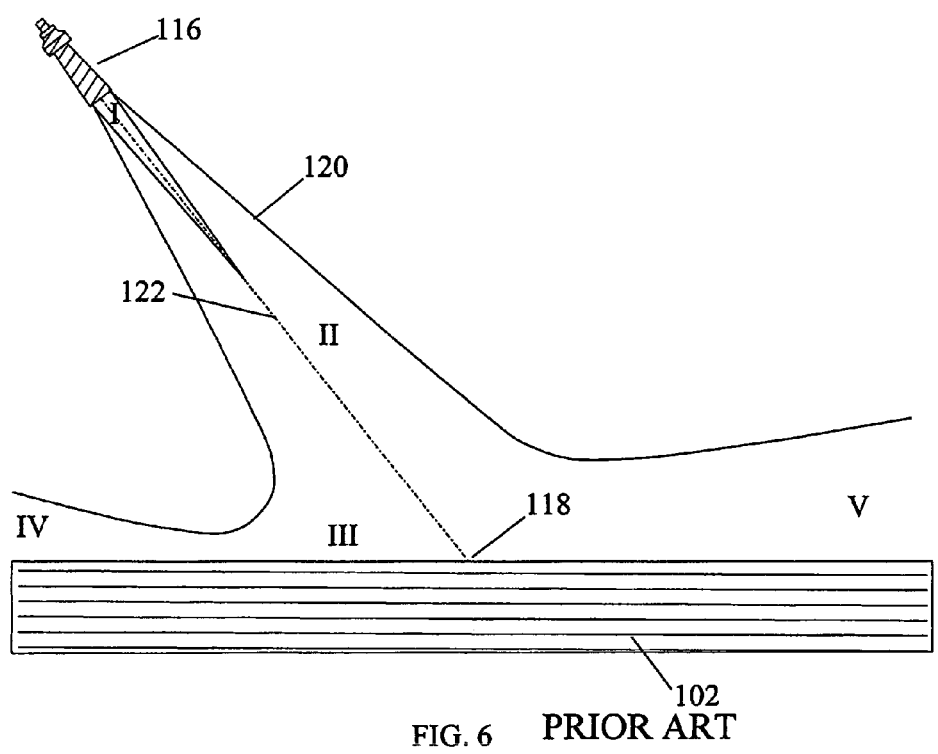
FIG. 6 is a schematic illustration of the velocity profile of the flow from an eductor directed onto the surface of a workpiece, when the eductor flow is at an angle which is not 900 with respect to the workpiece in a prior art cell.
Figure 7:
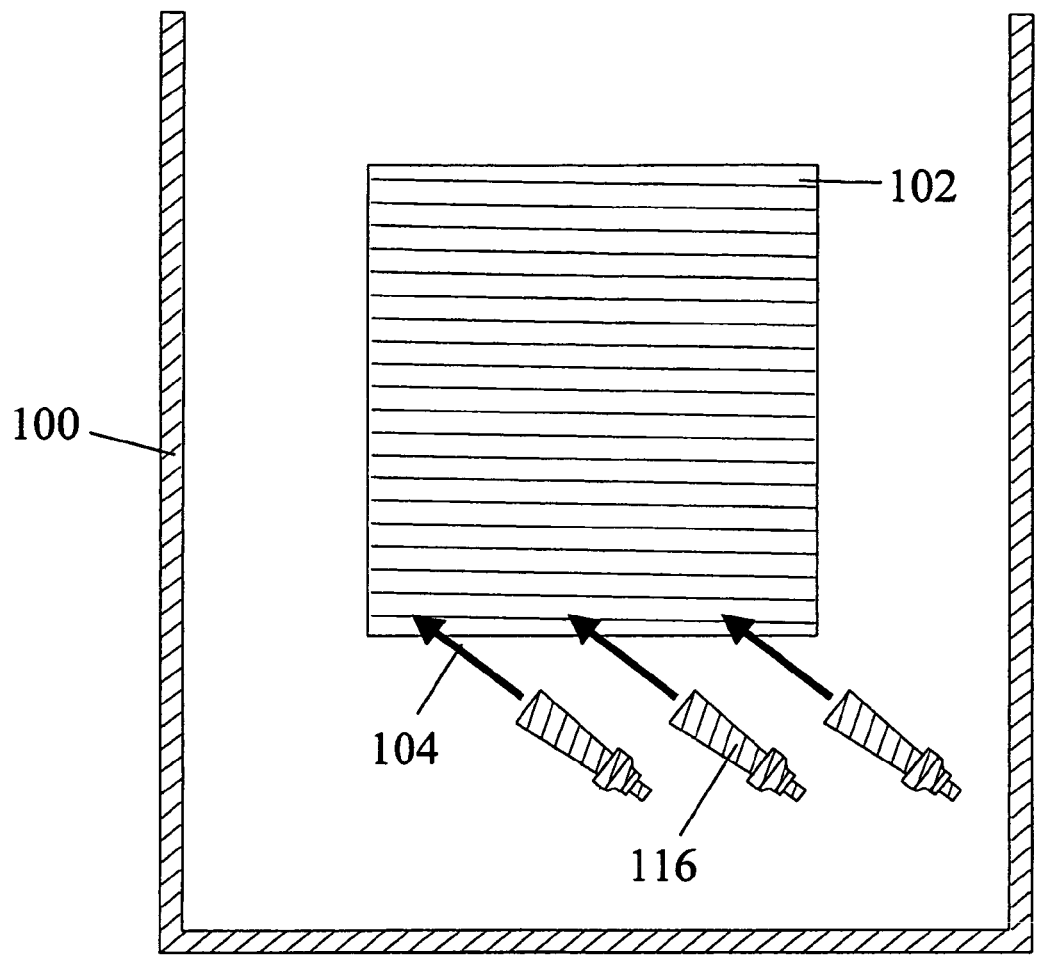
FIG. 7 is a schematic illustration of prior art depicting the cross-section of a plating cell containing a workpiece and two anodes, with angled eductors.
Figure 8:
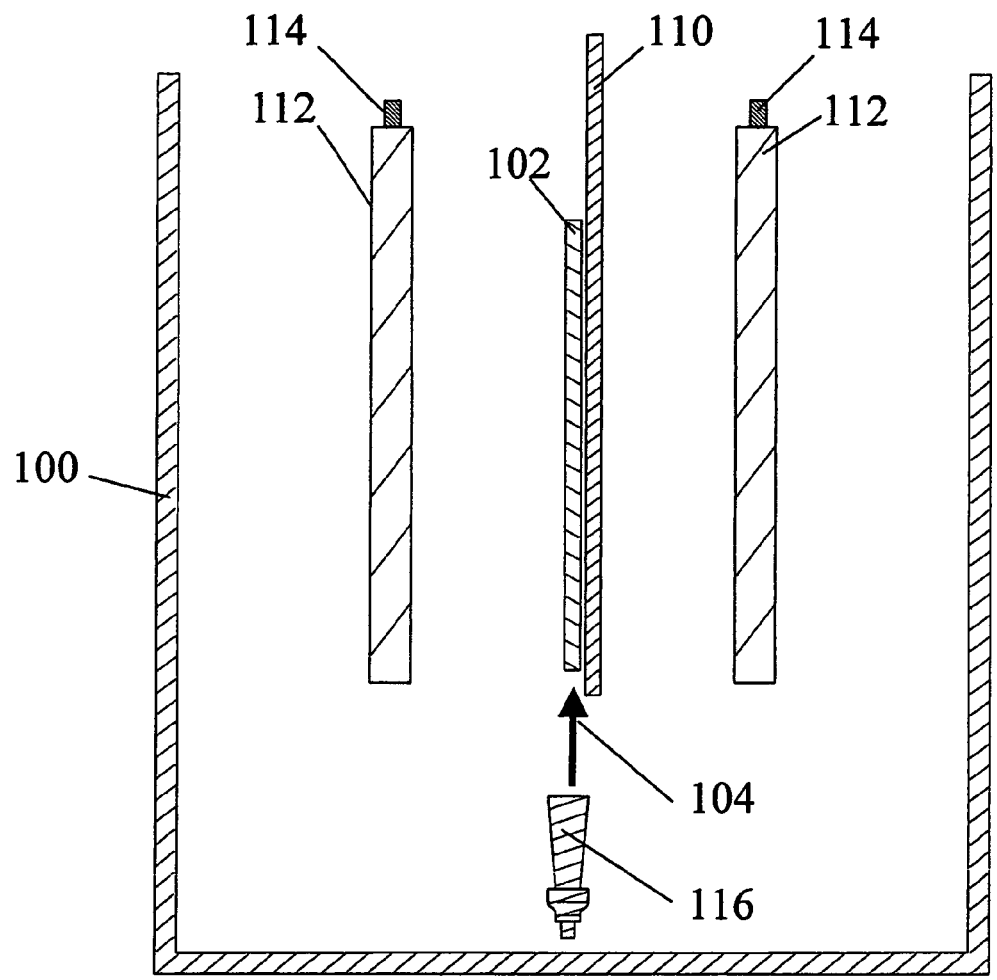
FIG. 8 is a schematic illustration of prior art depicting the cross-section of a plating cell containing a workpiece and two anodes, with vertical eductors directly below the workpiece.
Figure 9:
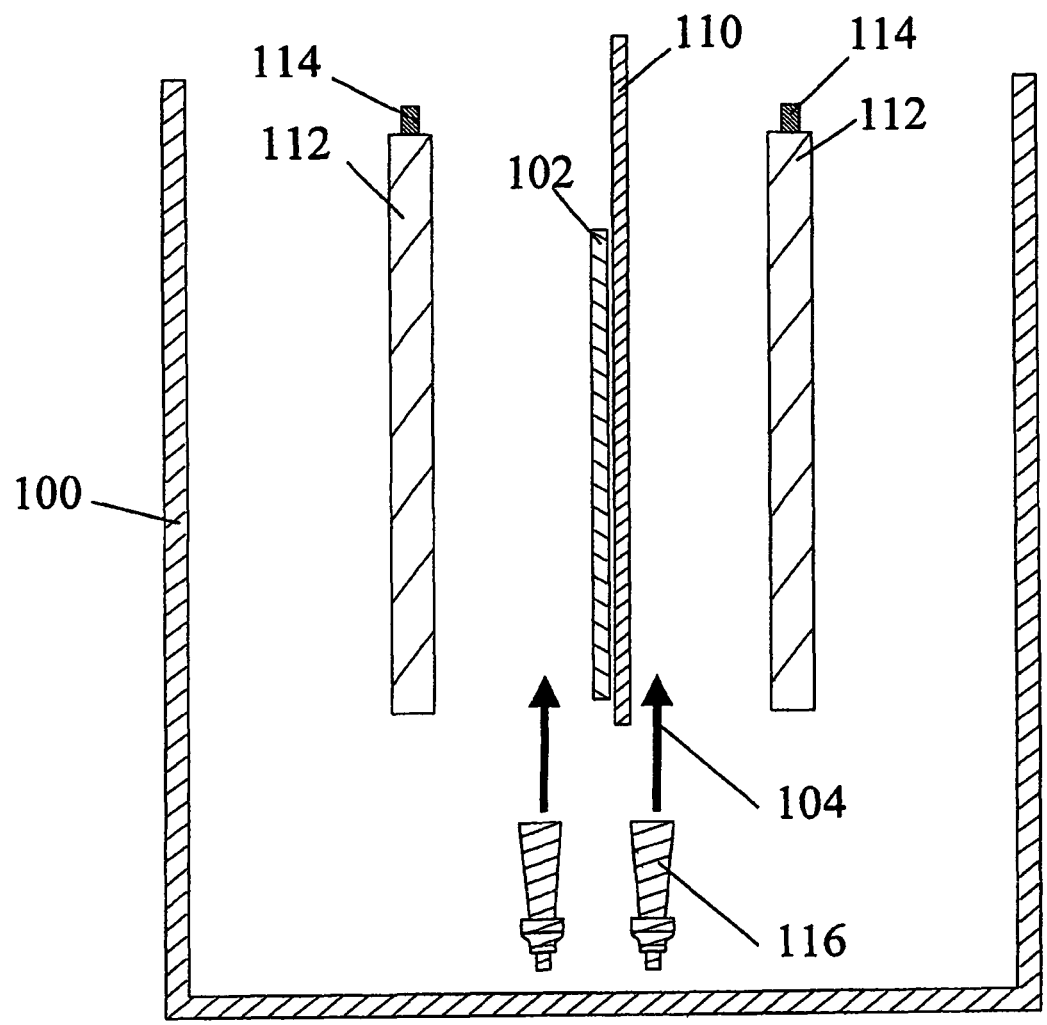
FIG. 9 is a schematic illustration of prior art depicting the cross-section of a plating cell containing a workpiece and two anodes, with vertical eductors below and to either side of the workpiece.

The experiments were conducted in the plating cell (100) shown in FIG. 2. An acid copper sulfate electrolyte containing ~97 g/L $CuSO_4$, 210-215 g/L of concentrated $H_2SO_4$, ~63 ppm $Cl^-$, and 350 ppm polyethylene glycol (PEG) was used as the copper electroplating bath. As known by those skilled in the art, the chloride/PEG acts as a suppressor and is not difficult to control. The plating bath does not contain difficult-to-monitor/control additives such as brighteners and/or levelers and hence the bath is considered "additive-free." The plating bath temperature was maintained in the range of 22 to 25° C.

Figure 13:
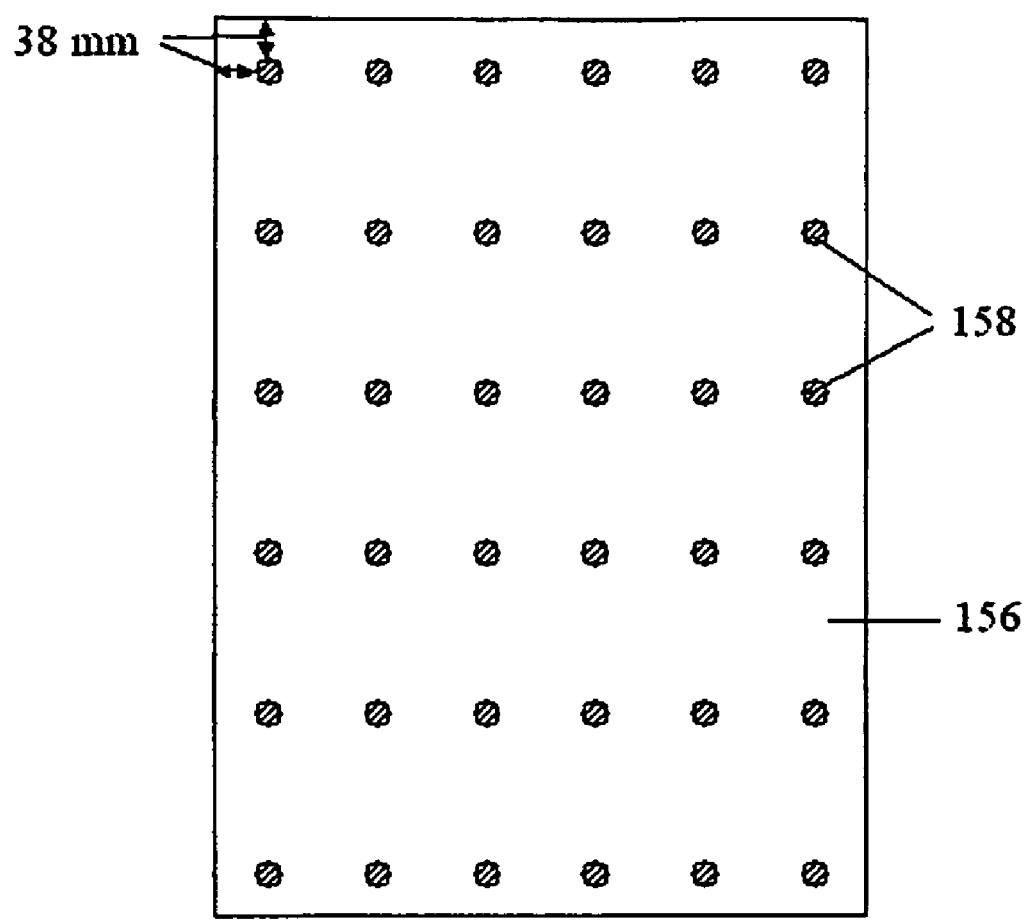
FIG. 13 is a schematic illustration of the thirty-six thickness measurement points on the copper foil, pulled off the stainless steel panel used in the plating experiments described in Examples 2 and 3.

The initial experiments for plating cell (100) characterization were conducted on a stainless steel panel (450 mm×600 mm), as a workpiece (102). The copper plating process was controlled by DC current at 25 A/ft$^2$ (provided by a PE86 dual output rectifier) to obtain a copper film with a thickness of about 25 micrometers on both surfaces of the stainless steel panel After each test, copper foils (156) that plated on both sides of the stainless steel panel workpiece (102) were peeled off to analyze the copper thickness distribution. FIG. 13 illustrates the position of each measuring point (158) on the copper foil (156). There were thirty-six equi-spaced measuring points on the foil (156) and the edge points were 38 mm away from the foil (156) side. The uniformity of copper deposits on the steel panel workpiece (102) surface was defined by the ratio of the standard deviation to the average copper thickness, expressed on a percent basis (($\sigma/\bar{a}$)×100%), that is, the coefficient of variation (CoV)). The quantity $\sigma$ is the standard deviation based on the measuring points; and $\bar{a}$ is the mean thickness that is given by: $\bar{a}=\Sigma h_i/n$ where n is the number of measuring points and $h_i$ is the copper thickness at each measuring point. For these experiments, n=36. The smaller the value of the CoV, the more uniformly is current distributed over the steel panel workpiece (102) surface, and the more uniformly is metal distributed over the steel panel workpiece (102) surface. The value of CoV for a conventional workpiece with dimensions of about 450 mm×600 mm in the electronics industry is about 10% to 12% although more typical values may be about 15%.

In this example the CoV value determined from analysis of the copper foil was 13.99%. The thickness of the copper deposit was measured with a micrometer.

EXAMPLE 2

This example illustrates the use of the plating cell (100) to deposit copper uniformly onto a workpiece (102), to demonstrate the effects of the various attributes of the plating cell (100) of the present invention, such as flow rate of electrolyte through the eductors (116), anodes (112) to workpiece (102) distance, oscillation (154) of the workpiece (102), and vibration (152) of the workpiece (102).

The experiments were conducted in the plating cell (100) shown in FIGS. 10 to 12. An acid copper sulfate electrolyte containing ~97 g/L of $CuSO_4$, 210-215 g/L of concentrated $H_2SO_4$, ~63 ppm $Cl^-$, and 350 ppm polyethylene glycol (PEG) was used as the copper electroplating bath for all experiments. The chloride/PEG is termed a suppressor and is not difficult to control. The plating bath does not contain difficult-to-monitor/control additives such as brighteners and/or levelers and hence we consider the bath as "additive-free." The plating bath temperature was maintained in the range of 22 to 25° C.

The initial experiments for plating cell (100) characterization were conducted on a stainless steel panel (450 mm×600 mm), as a workpiece (102). The cell operating parameters, which were eductor (116) flow rate (low flow designates flow with a pump setting about one-half the maximum (high) flow), oscillation (154) frequency, vibration (152) frequency, and anode (112) to steel panel workpiece (102) distance, were selected as factors to evaluate the effect of plating cell (100) configuration on the current distribution over the panel workpiece (102) surface. The copper plating process was controlled by DC current at 25 A/ft$^2$ (provided by a PE86 dual output rectifier) to obtain a copper film with a thickness of about 25 micrometers. In all experiments, the anode chamber (126) was used, as was the porous fiber cloth (128), and 152 mm of anode non-conducting shielding (130).

After each test, copper foils (156) that plated on both sides of the stainless steel panel workpiece (102) were peeled off to analyze the copper thickness distribution. FIG. 13 illustrates the position of each measuring point (158) on the copper foil (156). There were thirty-six equi-spaced measuring points on the foil (156) and the edge points were 38 mm away from the foil (156) side. The uniformity of copper deposits on the steel panel workpiece (102) surface was defined as described in Example 1 above, with n=36 in this example also. The desired percentage value of CoV for the cell conditions in the electronics industry and more particularly printed circuit board industry for panels of approximately this size is less than 10%.

The experimental matrix, designed using a full factorial method, is listed in Table 1. MINITAB software was used to design the factorial method, although other methods could be used. The target performance criterion for the initial cell experimental study was to plate approximately 25 micrometers of copper over the steel panel workpiece (102) surface and evaluate the uniformity of copper thickness distribution. As shown in Table 1, a CoV of less than 10% was achieved under the plating cell operating conditions of Test 5 to Test 12, and the lowest CoV value was achieved in Test 5.

TABLE 1

Factorial Matrix and CoV Results for Example 2.

| Test No. | Flow | Oscillation (cycles/min) | Vibration (cycles/min) | Distance* (mm) | CoV (%) |
|---|---|---|---|---|---|
| 1 | High | 26 | 0 | 290 | 12.11 |
| 2 | High | 12 | 0 | 290 | 12.55 |
| 3 | High | 12 | 1400 | 290 | 12.12 |
| 4 | High | 26 | 1400 | 290 | 12.35 |
| 5 | High | 26 | 1400 | 213 | 7.72 |
| 6 | High | 26 | 0 | 213 | 8.57 |
| 7 | High | 12 | 1400 | 213 | 9.54 |
| 8 | High | 12 | 0 | 213 | 9.19 |
| 9 | Low | 12 | 0 | 213 | 9.76 |
| 10 | Low | 12 | 1400 | 213 | 8.31 |
| 11 | Low | 26 | 1400 | 213 | 9.01 |
| 12 | Low | 26 | 0 | 213 | 9.54 |
| 13 | Low | 26 | 0 | 290 | 11.42 |
| 14 | Low | 26 | 1400 | 290 | 16.12 |
| 15 | Low | 12 | 1400 | 290 | 11.55 |
| 16 | Low | 12 | 0 | 290 | 11.13 |

*Distance refers to the anode-to-workpiece distance.

Figure 14:
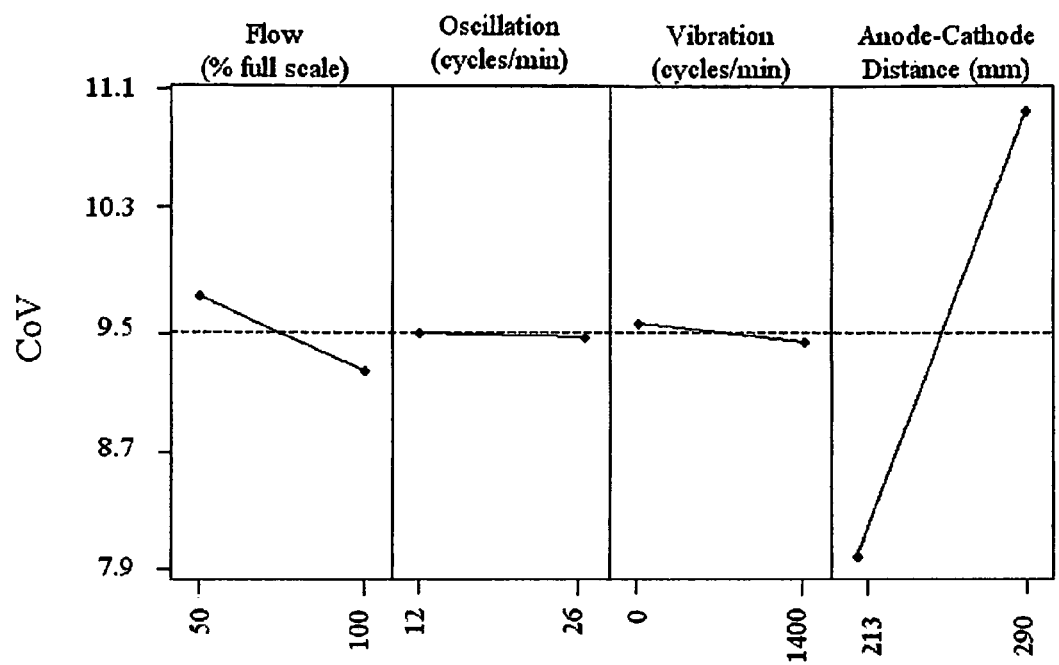
FIG. 14 is a set of graphs showing the effects of changing the attributes in the plating cell on the uniformity of metal deposition on a flat stainless steel panel. The smaller the coefficient of variation (CoV), the more uniform the metal deposition.

FIG. 14 shows a graph of the data from the factorial matrix. The graph plots the CoV versus the changes in each of the operating parameters and shows which operating parameter has the strongest influence on the uniformity of copper thickness across the surface of the stainless steel panel workpiece (102). FIG. 14 shows that the distance between the anodes (112), which controls the anode (112) to steel panel workpiece (102) distance, has the strongest influence on the uniformity of copper distribution over the steel panel workpiece (102), compared to the other parameters. However, one skilled in the art would recognize that oscillation and vibration may be important when the workpiece incorporates interconnects with fine pitch lines, through-holes, vias and the like. These data would also indicate that even closer anode (112) to steel panel workpiece (102) spacing may offer further improvements in copper uniformity.

These observations are confirmed by the data in Table 1 which show that a more uniform copper thickness distribution (low CoV) can be obtained by using a closer distance between the anode chamber (126) and the stainless steel panel workpiece (102). The Test 5 plating cell configuration gave the most uniform copper thickness distribution over the steel panel workpiece (102) surface, with the closest anode (112) to steel panel workpiece (102) distance, at a high flow rate, high oscillation frequency and high vibration frequency.

Based on the test results shown in FIG. 14, the effect of oscillation (154) and vibration (152) are unclear, although they suggest that higher vibration (152) and oscillation (154) frequencies will improve the uniformity of metal on the steel panel workpiece (102). The effects of oscillation (154) and vibration (152) might be seen more clearly on a patterned workpiece which has interconnect features such as fine pitch lines, through-holes, and vias and the like.

Example 3

This example illustrates the use of the plating cell (100) to deposit copper uniformly onto a workpiece (102), to demonstrate further effects of the various attributes of the plating cell (100), such as flow rate of electrolyte through the eductors (116), anodes (112) to workpiece (102) distance, use of an anode chamber (126), use of a porous fiber cloth (128), use of additional non-conducting shielding (130), and use of a baffle (138) under the anode chamber, on the current distribution over the panel workpiece (102) surface.

The experiments were conducted in the plating cell (100) shown in FIGS. 10 to 12. An acid copper sulfate electrolyte containing ~97 g/L of $CuSO_4$, 210-215 g/L of concentrated $H_2SO_4$, ~63 ppm $Cl^-$, and 350 ppm polyethylene glycol (PEG) was used as the copper electroplating bath for all experiments. The chloride/PEG acts as a suppressor and is not difficult to control. The plating bath does not contain difficult-to-monitor/control additives such as brighteners and/or levelers and hence we consider the bath as "additive-free." The plating bath temperature was maintained in the range of 22 to 25° C.

The initial experiments for cell characterization were conducted on a stainless steel panel (450 mm×600 mm), as a workpiece (102). The copper plating process was controlled by DC current at 25 A/ft$^2$ (provided by a PE86 dual output rectifier) to obtain a copper film with a thickness of about 25 micrometers.

After each test, copper foils (156) that plated on both sides of the stainless steel panel workpiece (102) were peeled off to analyze the copper thickness distribution. FIG. 13 illustrates the position of each measuring point (158) on the copper foil (156). There were thirty-six equi-spaced measuring points on the foil (156) and the edge points were 38 mm away from the foil (156) side. The uniformity of copper deposits on the steel panel workpiece (102) surface was defined as described in Example 1 above, with n=36 in this example also. The desired percentage value of CoV for the cell conditions in the electronics and more particularly printed circuit board industry is less than 10%.

The experimental matrix and results are listed in Table 2. The target performance criterion for the experimental study was to plate approximately 25 micrometers of copper over the steel panel workpiece (102) surface and evaluate the uniformity of copper thickness distribution.

TABLE 2

Experimental Matrix and CoV Results for Example 3.

| | | |
|---|---|---|
| 5C | Same as Test 5 but with 203 mm distance between anode and panel | 9.47 |
| 5D | Same as Test 5 but with 191 mm additional shielding on top of anode chamber | 5.24 |
| 5E | Same as Test 5 but no anode chamber in cell | 14.81 |
| 5F | Same as Test 5 with anode chamber without fiber cloth | 11.61 |
| 5CG | Test 5C conditions, adding baffle under the bottom of each anode | 8.31 |
| 5DH | Test 5D conditions, adding baffle under the bottom of each anode | 5.18 |
| 5DI | Test 5D conditions with fiber cloth (did not dummy the bath) | 5.45 |
| 5DJ | Test 5D conditions with fiber cloth | 5.39 |
| 11 | Low flow, 26 cycles/min oscillation, 1400 cycles/min vibration, 213 mm distance between anode center and panel, anode chamber with fiber cloth, 152 mm shielding on top of anode chamber. | 9.01 |
| 11C | Same as Test 11 but low flow and 203 mm distance between anode center and panel | 10.06 |
| 11E | Same as Test 11 but low flow, no anode chamber in cell | 14.11 |

Table 2 shows the effect of each plating cell attribute. Comparing Test 5 with 5C and Test 11 with 11C shows that decreasing the distance between the anode (112) and panel workpiece (102) from 213 to 203 mm decreased the uniformity (increased the CoV) of metal deposition across the steel panel workpiece (102). Comparing Test 5 with 5D shows that increasing the non-conducting shielding (130) at the top of the anode chamber (126) from 152 to 191 mm improved the uniformity (decreased the CoV) of metal deposition across the steel panel workpiece (102). Comparing Test 5 with 5E and Test 11 with 11E shows that removing the anode chambers (126) from the cell decreased the uniformity (increased the CoV) of metal deposition across the steel panel workpiece (102). Comparing Test 5 with 5F shows that removing the porous fiber cloth (128) from the anode chamber (126) decreased the uniformity (increased the CoV) of metal deposition across the steel panel workpiece (102). Comparing Test 5C with 5CG and Test 5D with 5DH shows that adding a baffle (138) under the bottom of each anode chamber (126) improved the uniformity (decreased the CoV) of metal deposition across the steel panel workpiece (102). Comparing Test 5D with 5DI and 5DJ shows that changing the porous fiber cloth (128) to that of a different manufacturer decreased the uniformity (increased the CoV) of metal deposition across the steel panel workpiece (102). In summary, the best result was achieved in Test 5DH, which ran at high flow, 26 cycles/min oscillation, 1400 cycles/min vibration, 213 mm distance between anode (112) and steel panel workpiece (102), used an anode chamber (126) with a porous fiber cloth (128), had 191 mm non-conducting shielding (130) on top of the anode chamber (126), and had a baffle (138) attached below both anode chambers (126).

The invention having now been fully described, it should be understood that it might be embodied in other specific forms or variations without departing from its spirit or essential characteristics. Accordingly, the embodiments described above are to be considered in all respects as illustrative and not restrictive, the scope of the invention being indicated by the appended claims rather than the foregoing description, and all changes which come within the meaning and range of equivalency of the claims are intended to be embraced therein.

References

1 M. Paunovic and M. Schlesinger (2000), *Modern Electroplating*, Wiley Inc. NY.
2 M. Paunovic and M. Schlesinger (1998), *Fundamentals of Electrochemical Deposition*, Wiley Inc. NY.
3 Ward, M., D. R. Gabe and J. N. Crosby (1999a), *Proc. European PCB Convention*, Munich, Germany, November.
4 Serductor™ is a trademark of Serfilco, Northbrook, Ill.
5 Weber, A. (2003), The Importance of Plating Cell Design and Hydrodynamics for Repeatable Product Quality in Latest Generation Vertical Platers for the Galvanic Industry, *IPC Printed Circuits Expo* 2003, Long Beach, Calif.
6 Chin, D-T. and Tsang, C-H. (1978), Mass Transfer to an Impinging Jet Electrode, *J. Electrochem. Soc.*, 125, 9, pp 1461-1470.
7 Hsueh, K-L. and D-T. Chin (1986a), Mass Transfer to a Cylindrical Surface from an Unsubmerged Impinging Jet, *J. Electrochem. Soc.*, 133, 1, pp 75-81.
8 Hsueh, K-L. and D-T. Chin (1986b), Mass Transfer of a Submerged Impinging Jet on a Cylindrical Surface, *J. Electrochem. Soc.*, 133, 9, pp 1845-1850.
9 Ward, M., D. R. Gabe, and J. N. Crosby (1998), Novel Agitation for PCB Production: Use of Eductor Technology, *Trans IMF*, 76, 4, pp 121-126.
10 Ward, M., D. R. Gabe, and J. N. Crosby (1999b), Exploitation of Eductor Agitation in Copper Electroplating, *Proc. SURFIN/99*, June 21-24, Cincinnati, Ohio.
11 Chin, D-T. and M. Agarwal (1991), Mass Transfer from an Oblique Impinging Slot Jet, *J. Electrochem. Soc.*, 138, 9, pp 2643-2650.
12 Carano, M. (2003), Hole Preparation & Metallization of High Aspect Ratio, High Reliability Back Panels, Part-2, *Circuitree*, February, pp 10-22.

What is claimed is:

1. A plating cell comprising:
a first compartment housing:
a workpiece holder upon which a workpiece is mountable;
a housing defining an anode chamber, the housing having a flat porous cloth forming the front face of the anode chamber positioned to define only the surface of the housing that faces the workpiece holder such that a portion of the anode chamber is located opposite the entire surface of the workpiece when mounted on the workpiece holder;
an anode housed in the anode chamber defined by the housing;
wherein the anode chamber is positioned such that the porous cloth is interposed between the anode and the workpiece holder in a planar parallel relationship to the workpiece holder, wherein the porous cloth spreads the current distribution between the anode and the workpiece holder such that the anode chamber acts as a virtual anode;
a plurality of eductors for directing an electrolyte solution into the plating cell, the eductors being located horizontally under the anode chamber, and
a solution flow dampening member at least coextensive with the length of the housing defining the anode chamber, the solution flow dampening member having a flow-directing surface that is longer than the length of the workpiece when mounted on the workpiece holder and is shaped such that electrolyte solution ejected from the horizontally directed eductors is directed as a vertical solution flow that is parallel to and between the porous cloth and the workpiece holder; and
a second compartment separated from the first compartment by a baffle that defines an opening therein, wherein the opening is positioned more proximate the top of the plating cell than the top of a workpiece when mounted in the workpiece holder;
wherein the vertical solution flow changes direction to a unidirectional horizontal solution flow once past the top of a workpiece to flow through the hole in the baffle and into the second compartment.

2. The plating cell of claim 1, wherein the workpiece holder is capable of holding a workpiece selected from the group consisting of a printed circuit board, printed wiring board, high density interconnect printed circuit board, high density interconnect printed wiring board, wafer level package, and chip scale package.

3. The plating cell of claim 2, wherein the distance between the anode and the workpiece is about 165 to about 300 mm.

4. The plating cell of claim 3, wherein the distance between the anode and the workpiece is about 210 to about 250 mm.

5. The plating cell of claim 4, wherein the distance between the anode and the workpiece is about 210 to about 220 mm.

6. The plating cell of claim 2, wherein the dimensions of the workpiece range from about 150 mm by about 150 mm to about 5 meters by about 5 meters.

7. The plating cell of claim 2, wherein the dimensions of the workpiece are about 200 mm to about 300 mm diameter.

8. The plating cell of claim 2, wherein the cell provides metal deposition across the workpiece having a coefficient of variability less than about 10%.

9. The plating cell of claim 8, wherein the coefficient of variability is less than about 7%.

10. The plating cell of claim 9, wherein the coefficient of variability is less than about 5%.

11. The plating cell of claim 1, further comprising a vibrator for the workpiece holder.

12. The plating cell of claim 11, further comprising an oscillator for the workpiece holder, the anode, or both the workpiece holder and the anode.

13. The plating cell of claim 1, further comprising an oscillator for the workpiece holder, the anode, or both the workpiece holder and the anode.

14. The plating cell of claim 1, wherein the electrolyte solution contains metal ions selected from the group consisting of copper ions, gold ions, nickel ions, tin ions, and the metal ions derived from lead-tin solder.

15. The plating cell of claim 1 wherein the flow-directing surface is a curved surface.

16. The plating cell of claim 15 wherein the flow-directing surface has a radius of curvature of about 6 to 12 inches.

17. The plating cell of claim 1 wherein the flow-directing surface is member an inclined planar surface.

18. The plating cell of claim 1, further comprising a baffle below the anode chamber configured to prevent the electrolyte solution from flowing to the other side of the anode chamber.

19. The plating cell of claim 1, wherein the anode chamber contains a non-conducting shield positioned at the top of the anode chamber overlying an upper periphery of the porous cloth to reduce edge effects.

20. The plating cell of claim 1, wherein the anode chamber contains a non-conducting shield positioned at the top of the anode chamber overlying an upper periphery of the porous cloth to reduce edge effects.

21. The plating cell of claim 1 wherein the porous cloth has a porosity of 2 to 4 ft$^3$/min.

22. The plating cell of claim 21 wherein the porous cloth is a polymeric filter material.

23. The plating cell of claim 22 wherein the porous cloth is a 100% polypropylene filter material.

24. A plating cell comprising:
a workpiece holder upon which a workpiece is mountable;
a housing defining an anode chamber, the housing having a flat porous cloth forming the front face of the anode chamber positioned to define only the surface of the housing that faces the workpiece holder such that a portion of the anode chamber is located opposite the entire surface of the workpiece when mounted on the workpiece holder and having a non-conducting shield forming the upper edge of the anode chamber and overlying an upper periphery of the porous cloth to reduce edge effects;
an anode housed in the anode chamber defined by the housing;
wherein the porous cloth is oriented in a planar parallel relationship to a major surface of the workpiece when mounted on the workpiece holder and spreads the current distribution between the anode and the workpiece holder such that the anode chamber acts as a virtual anode;
a plurality of eductors for directing an electrolyte solution into the plating cell, the eductors being located horizontally under the anode chamber,
a solution flow dampening member at least coextensive with the length of the housing defining the anode chamber, the solution flow dampening member having a flow-directing surface that is longer than the length of the workpiece when mounted on the workpiece holder and is shaped such that electrolyte solution ejected from the horizontally directed eductors is directed as a vertical solution flow between the anode chamber and the workpiece holder; and
a baffle located between the anode chamber and the eductors, the baffle configured to prevent the electrolyte solution from flowing back past the eductors to the other side of the anode chamber;
wherein the plating cell provides a metal deposition across a workpiece when positioned in the workpiece holder having a coefficient of variability less than about 7%.

25. The plating cell of claim 24, wherein the distance between the anode chamber and the workpiece holder is adjustable.

26. The plating cell of claim 25, wherein when the workpiece holder holds a workpiece, the distance between the anode and the workpiece is about 165 to about 300 mm.

27. A plating cell comprising:
a workpiece holder;
an anode housed in an anode chamber of a size greater than a workpiece mountable on the workpiece holder, the anode chamber having a front face facing the workpiece holder, the front face of the anode chamber being formed by a flat porous cloth oriented in a planar parallel relationship to a major surface of the workpiece when mounted on the workpiece holder, the flat porous cloth spreads the current distribution between the anode and the workpiece such that the anode chamber acts as a virtual anode;
a horizontally directed educator;
a solution flow dampening member at least coextensive with the length of the anode chamber, the solution flow dampening member having a flow-directing surface that is longer than the length of the workpiece when mounted on the workpiece holder and is shaped such that an electrolyte solution ejected from the horizontally directed eductor is directed as a vertical solution flow that is parallel to and between the flat porous cloth and the workpiece when mounted on the workpiece holder.

* * * * *

UNITED STATES PATENT AND TRADEMARK OFFICE
CERTIFICATE OF CORRECTION

PATENT NO. : 8,329,006 B2
APPLICATION NO. : 12/431030
DATED : December 11, 2012
INVENTOR(S) : Lawrence E. Gebhart et al.

Page 1 of 1

It is certified that error appears in the above-identified patent and that said Letters Patent is hereby corrected as shown below:

Column 16, Claim 27, Line 42, "a horizontally directed educator;"

should read -- a horizontally directed eductor; --

Signed and Sealed this
Nineteenth Day of March, 2013

Teresa Stanek Rea
*Acting Director of the United States Patent and Trademark Office*